United States Patent
Song

(10) Patent No.: US 10,446,785 B2
(45) Date of Patent: Oct. 15, 2019

(54) LIGHT-EMITTING SUBSTRATE AND METHOD FOR MANUFACTURING THE SAME

(71) Applicant: BOE TECHNOLOGY GROUP CO., LTD., Beijing (CN)

(72) Inventor: Wenfeng Song, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/000,321

(22) Filed: Jun. 5, 2018

(65) Prior Publication Data

US 2019/0044090 A1  Feb. 7, 2019

(30) Foreign Application Priority Data

Aug. 3, 2017  (CN) .......................... 2017 1 0656152

(51) Int. Cl.
  *H01L 27/32*    (2006.01)
  *H01L 51/52*    (2006.01)
  (Continued)

(52) U.S. Cl.
  CPC ........ *H01L 51/5218* (2013.01); *H01L 27/326* (2013.01); *H01L 27/3246* (2013.01); *H01L 27/3279* (2013.01); *H01L 51/0005* (2013.01); *H01L 51/0096* (2013.01); *H01L 51/5012* (2013.01); *H01L 51/5225* (2013.01);
  (Continued)

(58) Field of Classification Search
  CPC ....................................................... H01L 27/30
  See application file for complete search history.

(56) References Cited

U.S. PATENT DOCUMENTS

2014/0377939 A1  12/2014  Khachatryan
2015/0144922 A1   5/2015  Moon et al.
(Continued)

FOREIGN PATENT DOCUMENTS

CN  104393191 A  3/2015
CN  104681589 A  6/2015
(Continued)

OTHER PUBLICATIONS

Chinese Office Action in Chinese Application No. 201710656152.0, dated Aug. 28, 2018 with English translation.

(Continued)

*Primary Examiner* — Cheung Lee
(74) *Attorney, Agent, or Firm* — Collard & Roe, P.C.

(57) ABSTRACT

A light-emitting substrate and a method for manufacturing the light-emitting substrate are provided. In the light-emitting substrate, each of a plurality of pixel units includes an anode and a light-emitting layer sequentially provided on a base substrate, the light-emitting substrate further includes a cathode layer covering the plurality of pixel units and a region which is between the adjacent ones of the pixel units, an auxiliary electrode is provided below the cathode layer, the auxiliary electrode includes a plurality of auxiliary electrode strips which include a plurality of first auxiliary electrode strips extending along an extension direction of each pixel unit row and/or a plurality of second auxiliary electrode strips extending along an extension direction of each pixel unit column, and at least a part of the plurality of auxiliary electrode strips is electrically connected to the cathode layer.

16 Claims, 4 Drawing Sheets

(51) Int. Cl.
  *H01L 51/00*    (2006.01)
  *H01L 51/56*    (2006.01)
  *H01L 51/50*    (2006.01)

(52) U.S. Cl.
  CPC ...... *H01L 51/5228* (2013.01); *H01L 51/5234* (2013.01); *H01L 51/56* (2013.01)

(56) References Cited

U.S. PATENT DOCUMENTS

2016/0293888 A1  10/2016  Shim et al.
2017/0110530 A1  4/2017  Lee et al.

FOREIGN PATENT DOCUMENTS

| CN | 105679806 A | 6/2016 |
| CN | 106057844 A | 10/2016 |
| CN | 106601770 A | 4/2017 |
| CN | 106992204 A | 7/2017 |

OTHER PUBLICATIONS

Chinese Office Action in Chinese Application No. 201710656152.0, dated May 31, 2019 with English translation.

LIGHT-EMITTING SUBSTRATE AND METHOD FOR MANUFACTURING THE SAME

The application claims priority to the Chinese patent application No. 201710656152.0 filed on Aug. 3, 2017, the entire disclosure of which is incorporated herein by reference as part of the present application.

TECHNICAL FIELD

Embodiments of the present disclosure relate to a light-emitting substrate and a method for manufacturing the light-emitting substrate.

BACKGROUND

Organic light-emitting diode (OLED) display technology has become the next generation display technology with high competitiveness and a broad development prospect because of processing a series of advantages, such as all solid state structure, high brightness, all viewing angle display, fast response, flexible display etc.

In the field of large-size organic light-emitting display, for example, a method of using white light and a color filter is used to display and a top emission mode is adopted to obtain a large opening rate and a low power consumption. As for a large-size display device of top emission mode, a transparent cathode layer on the light-exit side of the display device is, for example, a planar film layer covering the whole display region of the display device; in order to increase the transmittance rate, the transparent cathode layer is designed to be thin, and the transparent cathode layer which is relatively thin and covers a large region is easy to produce a large voltage difference between the center portion and the peripheral portion of the cathode layer, which affects the performance and life of the display device to a large extent.

For example, an auxiliary electrode is directly arranged on the transparent cathode layer to reduce the large voltage difference between the center portion and the peripheral portion. One solution is forming an auxiliary electrode directly on the transparent cathode layer; because the transparent cathode layer is covered with a sealing layer and the sealing layer is an integrated inorganic insulating layer, it is difficult to ensure a good sealing effect after forming the sealing layer on the auxiliary electrode and the transparent cathode layer. Another solution is forming an auxiliary electrode on a packaging cover substrate, and then the packaging cover substrate provided with the auxiliary electrode is aligned with and jointed with a lower substrate provided with the transparent cathode layer; in order to prevent the display effect in the display region from being affected by the auxiliary electrode, the auxiliary electrode is generally arranged in regions respectively between adjacent pixel units of the display device, which increases the difficulty of the aligning and jointing the packaging cover substrate with the lower substrate and reduces the production yield of the display panel of the display device.

SUMMARY

At least one embodiment of the present disclosure provides a light-emitting substrate and a method for manufacturing the light-emitting substrate, the embodiment of the present disclosure can reduce the voltage difference between the center portion and the peripheral portion of a cathode layer of a large-size light-emitting substrate, ensure the sealing effect of the sealing layer on an auxiliary electrode and the cathode layer of the light-emitting substrate and reduce the difficulty of manufacturing the light-emitting substrate at the same time.

At least one embodiment of the present disclosure provides a light-emitting substrate, the light-emitting substrate includes a base substrate and a plurality of pixel units arranged in an array on the base substrate, the plurality of pixel units include a plurality of pixel unit rows and a plurality of pixel unit columns, each of the pixel units includes an anode and a light-emitting layer sequentially provided on the base substrate, the light-emitting substrate further includes a cathode layer covering the plurality of pixel units and a region which is between adjacent ones of the pixel units and an auxiliary electrode which is provided below the cathode layer, the auxiliary electrode includes a plurality of auxiliary electrode strips, the plurality of auxiliary electrode strips include a plurality of first auxiliary electrode strips extending along an extension direction of each of the pixel unit rows and/or a plurality of second auxiliary electrode strips extending along an extension direction of each of the pixel unit columns, and at least a part of the plurality of auxiliary electrode strips is electrically connected to the cathode layer.

For example, the first auxiliary electrode strips are respectively in regions between adjacent ones of the pixel unit rows; and the second auxiliary electrode strips are respectively in regions between adjacent ones of the pixel unit columns.

For example, the light-emitting substrate further includes a pixel definition layer which defines the plurality of pixel units of the light-emitting substrate, and the pixel definition layer includes a first partition wall structure provided in the regions between adjacent ones of the pixel unit rows and in the regions between adjacent ones of the pixel unit columns; each of the pixel units includes one light-emitting layer, light-emitting layers of different pixel units are spaced apart from each other, the plurality of auxiliary electrode strips are on the first partition wall structure, and each auxiliary electrode strip is in a region between the light-emitting layers of the pixel units adjacent to the auxiliary electrode strip.

For example, a top of each auxiliary electrode strip is below tops of the light-emitting layers of the pixel units adjacent to the auxiliary electrode strip.

For example, a second partition wall structure is provided at two sides of each auxiliary electrode strip, the two sides of which are opposite to the pixel units adjacent to the auxiliary electrode strip, a bottom of the second partition wall structure is connected to a top of the first partition wall structure, and each auxiliary electrode strip is spaced apart from the light-emitting layers of the pixel units adjacent to the auxiliary electrode strip by the second partition wall structure.

For example, the light-emitting substrate further includes a sacrificial layer pattern, and the sacrificial layer pattern is between a layer where the plurality of auxiliary electrode strips are provided and the cathode layer.

For example, a material of the sacrificial layer pattern includes an organic material mixed with metal nano-particles.

For example, the light-emitting substrate further includes a pixel definition layer provided on the base substrate, the pixel definition layer defines the plurality of pixel units of the light-emitting substrate, and the pixel definition layer includes a first partition wall structure provided in the regions between adjacent ones of the pixel unit rows and in the regions between adjacent ones of the pixel unit columns; and the light-emitting layer covers the plurality of pixel units and the region which is between the adjacent ones of the pixel units, and the plurality of auxiliary electrode strips are on the light-emitting layer.

For example, the anode is a reflective anode, and the cathode layer is a transparent cathode layer.

At least one embodiment of the present disclosure further provides a manufacturing method of a light-emitting substrate, and the manufacturing method includes: forming a plurality of pixel units arranged in an array and forming an auxiliary electrode which includes a plurality of auxiliary electrode strips on a base substrate, and forming a cathode layer covering the plurality of pixel units and a region which is between adjacent ones of the pixel units. In the manufacturing method, the plurality of pixel units include a plurality of pixel unit rows and a plurality of pixel unit columns, the plurality of auxiliary electrode strips include first auxiliary electrode strips formed respectively in regions between adjacent ones of the pixel unit rows and/or second auxiliary electrode strips formed respectively in regions between adjacent ones of the pixel unit columns, each of the pixel units includes an anode and a light-emitting layer sequentially provided on the base substrate; and the plurality of auxiliary electrode strips are below the cathode layer and at least a part of the plurality of auxiliary electrode strips is electrically connected to the cathode layer.

For example, the manufacturing method further includes: before forming the plurality of auxiliary electrode strips, forming a pixel definition layer on the base substrate, wherein the pixel definition layer includes a first partition wall structure provided in the regions between adjacent ones of the pixel unit rows and in the regions between adjacent ones of the pixel unit columns; and forming a second partition wall structure on the first partition wall structure and at two opposite sides of the pixel units adjacent to each other, wherein a bottom of the second partition wall structure is connected to a top of the first partition wall structure, and each auxiliary electrode strip is spaced apart from the light-emitting layers of the pixel units adjacent to the auxiliary electrode strip by the second partition wall structure. In the manufacturing method, forming the plurality of auxiliary electrode strips includes: forming the first auxiliary electrode strips respectively in spaces, each of which is formed by two opposite portions of the second partition wall structure between adjacent ones of the pixel unit rows, and/or forming second auxiliary electrode strips respectively in spaces, each of which is formed by two opposite portions of the second partition wall structure between adjacent ones of the pixel unit columns.

For example, before forming the cathode layer, the manufacturing method further includes: forming a sacrificial layer in a region corresponding to the plurality of auxiliary electrode strips; forming a light-emitting material layer covering the plurality of pixel units and the region which is between the adjacent ones of the pixel units; and removing a portion of the sacrificial layer provided on the at least a part of the plurality of auxiliary electrode strips and removing a portion of the light-emitting material layer provided on the at least a part of the plurality of auxiliary electrode strips, so that the at least a part of the plurality of auxiliary electrode strips is electrically connected with the cathode layer.

For example, the portion of the sacrificial layer provided on the at least a part of the plurality of auxiliary electrode strips and the portion of the light-emitting material layer provided on the at least a part of the plurality of auxiliary electrode strips are removed by heating the sacrificial layer.

For example, a heating temperature of heating the sacrificial layer is less than or equal to 100 degrees Celsius.

For example, the sacrificial layer which is heated forms a powdered sacrificial layer due to expansion, and the portion of the light-emitting material layer forms a powdered light-emitting material layer; and the manufacturing method further comprises: removing the powdered sacrificial layer and the powdered light-emitting material layer by adsorption.

For example, a preset voltage is applied for a preset time period to the plurality of auxiliary electrode strips to remove the portion of the sacrificial layer provided on the at least a part of the plurality of auxiliary electrode strips and remove the portion of the light-emitting material layer provided on the at least a part of the plurality of auxiliary electrode strips.

For example, a ratio of a thickness of the sacrificial layer to a thickness of the light-emitting material layer is larger than or equal to 1 in a region where the sacrificial layer is in contact with the light-emitting material layer.

For example, the sacrificial layer is formed by an inkjet printing method.

For example, a material of the sacrificial layer includes an organic material mixed with metal nano-particles.

For example, the material of the sacrificial layer further comprises a foaming agent.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
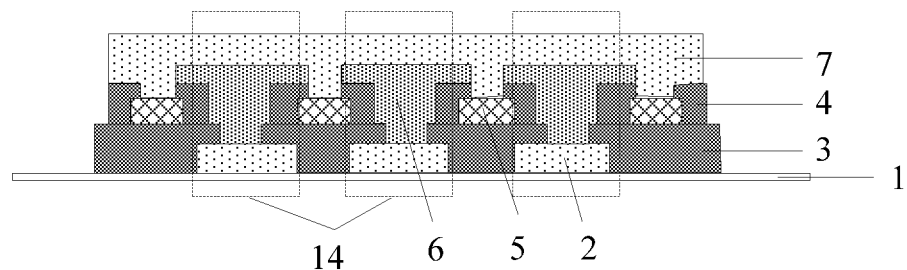
FIG. 1A is a first schematic cross-section view of a light-emitting substrate provided by at least an embodiment of the disclosure.
Figure 1B:
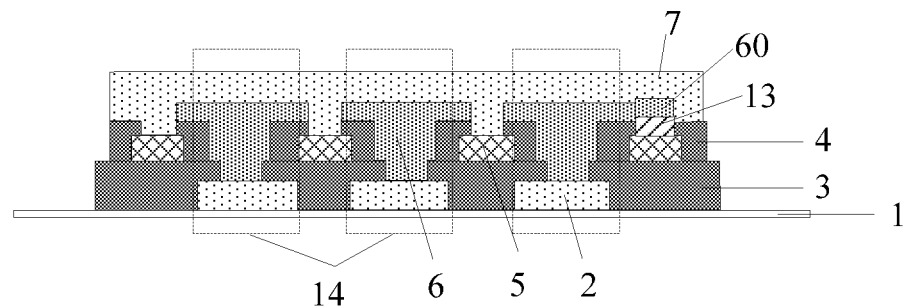
FIG. 1B is a second schematic cross-section view of the light-emitting substrate provided by at least an embodiment of the disclosure.
Figure 1C:
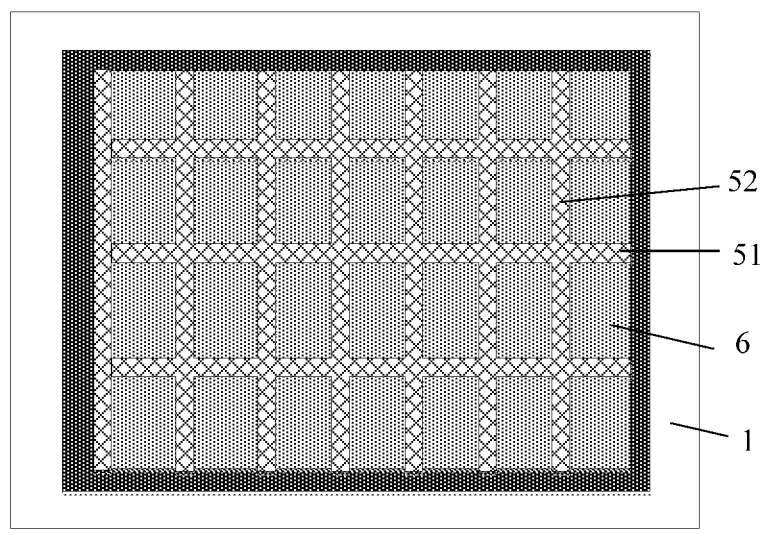
FIG. 1C is a schematic plan view of the light-emitting substrate provided by at least one embodiment of the present disclosure.

Referring to FIG. 1A-FIG. 1C, at least one embodiment of the present disclosure provides a light-emitting substrate, and the light-emitting substrate includes: a pixel definition layer which is on a base substrate 1 and defines a plurality of pixel units 14 of the light-emitting substrate, the plurality of pixel units 14 are arranged in an array and include a plurality of pixel unit rows and a plurality of pixel unit columns, and the pixel definition layer includes a first partition wall structure 3 provided in regions respectively between adjacent ones of the pixel unit rows and in regions respectively between adjacent ones of the pixel unit columns.

As illustrated in FIG. 1A and FIG. 1B, each of the pixel units 14 includes an anode 2 and a light-emitting layer 6 sequentially provided on the base substrate 1, that is, the anode 2 is between the light-emitting layer 6 and the base substrate 1. For example, the light-emitting layer 6 is an organic light-emitting layer, and for example, in this case, the light-emitting substrate is an organic light-emitting diode array substrate. For example, in some embodiments, the light-emitting layer 6 is an inorganic light-emitting layer.

As illustrated in FIG. 1A and FIG. 1B, the light-emitting substrate further includes a cathode layer 7 covering the plurality of pixel units 14 and a region which is between adjacent ones of the pixel units 14. For example, the cathode layer 7 covers all the pixel units 14, that is, the cathode layer 7 has a continuously-formed planar structure. For example, the cathode layer 7 is a structure of a single film or a laminated structure of multilayer films.

As illustrated in FIG. 1A and FIG. 1B, an auxiliary electrode is provided below the cathode layer 7 and is electrically connected with the cathode layer 7, the auxiliary electrode includes a plurality of auxiliary electrode strips 5, and the plurality of auxiliary electrode strips 5 are between the first partition wall structure 3 and the cathode layer 7. For example, the auxiliary electrode strips 5 of the auxiliary electrode directly contact the cathode layer 7 to realize an electrical connection between the auxiliary electrode strips 5 and the cathode layer 7, as illustrated in FIG. 1A and FIG. 1B. For example, in some embodiments, the auxiliary electrode strips 5 are connected to the cathode layer 7 by a conductive connector.

As illustrated in FIG. 1C, the auxiliary electrode strips 5 include a plurality of first auxiliary electrode strips 51 extending along the extension direction of each pixel unit row and/or a plurality of second auxiliary electrode strips 52 extending along the extension direction of each pixel unit columns. For example, the first auxiliary electrode strips 51 are respectively in regions which are respectively between adjacent ones of the pixel unit rows; the second auxiliary electrode strips 52 are respectively in regions which are respectively between adjacent ones of the pixel unit columns.

For example, the light-emitting substrate is a display panel. For example, in some embodiments, the light-emitting substrate is used as a light source. For example, the light-emitting substrate is used as a back-light source which provides back light for a display panel.

In at least one embodiment of the present disclosure, the light-emitting substrate further includes a continuously-formed cathode layer covering the plurality of pixel units and the region which is between the adjacent ones of the pixel units, and an auxiliary electrode which is electrically connected to the cathode layer is provided below the cathode layer; because the auxiliary electrode is in parallel connection with the cathode layer and is below the cathode layer, at least one embodiment of the present disclosure reduces the voltage difference between the center portion and the peripheral portion of the cathode layer of a large-size light-emitting substrate and the edge of the cathode layer of the large-size light-emitting substrate, ensures the sealing effect of the sealing layer on the cathode layer and reduces the difficulty of manufacturing the light-emitting substrate at the same time.

Because the first partition wall structure is used for defining the pixel units, that is, used for dividing a region of the light-emitting substrate into the plurality of pixel units arranged in an array, the first partition wall structure is provided in the region between any adjacent two pixel unit rows and in the region between any adjacent two pixel unit columns, that is: the first partition wall includes first portions and second portions, each first portion of the first partition wall structure extends along the extension direction of each pixel unit row and is provided in the region between the adjacent pixel unit rows, and each second portion of the first partition wall structure extends along the extension direction of each pixel unit column and is provided in the region between the adjacent pixel unit columns.

The auxiliary electrode strips of the auxiliary electrode are mainly used for improving the uniformity of voltage distribution, therefore a setting mode of the auxiliary electrode stripes can be flexibly selected according to a region that needs to be improved. For example, the auxiliary electrode only includes first auxiliary electrode strips, each of which extends along the extension direction of each pixel unit row and is provided in the region between the adjacent pixel unit rows; or the auxiliary electrode only includes second auxiliary electrode strips, each of which extends along the extension direction of each pixel unit column and is provided in the region between the adjacent pixel unit columns; or the auxiliary electrode includes first auxiliary electrode strips, each of which extends along the extension direction of each pixel unit row and is provided in the region between the adjacent pixel unit rows, and includes second auxiliary electrode strips, each of which extends along the extension direction of each pixel unit column and is provided in the region between the adjacent pixel unit columns. For example, the first auxiliary electrode strips are respectively provided in only a part of the regions between the adjacent pixel unit rows, or the first auxiliary electrode strips are provided in all the regions between the adjacent pixel unit rows. Similarly, the second auxiliary electrode strips are provided in only a part of the regions between the adjacent pixel unit columns, or the second auxiliary electrode strips are provided in all the regions between the adjacent pixel unit columns.

Because the first partition wall structure used for defining the pixel units is in the regions between the adjacent pixel units, in order to prevent the display effect in a region of the pixel units from being affected by the auxiliary electrode, for example, the auxiliary electrode strips of the auxiliary electrode are also respectively in the regions between the adjacent pixel units. Because the anodes below the first partition wall structure are spaced apart from each other by the first partition wall and the auxiliary electrode strips are used for reducing a voltage difference of the cathode layer on the auxiliary electrode strips, for example, the auxiliary electrode strips of the auxiliary electrode are on the first partition wall structure.

As for each of the pixel units, each of the pixel units has an anode and the light-emitting layer. In order to realize an independent control of the light-emitting of each of the pixel units, at least anodes of the pixel units are spaced apart from each other by the pixel definition layer and are insulated from each other. As for the light-emitting layer, as illustrated in FIG. 1A and FIG. 1B, light-emitting layers 6 of the pixel units 14 are spaced apart from each other and are independent from each other; or the light-emitting layers 6 of the pixel units 14 are connected to each other, that is, the light-emitting layer 6 of the whole light-emitting substrate is an integrated film structure, for example, referring to FIG. 2, the light-emitting layer 6 is an integrated planar structure covering all the pixel units 14 and all the region which is between the adjacent pixel units 14. It should be noted that the light-emitting layer 6 is a structure of a single film or a laminated structure of multilayer films.

Figure 2:
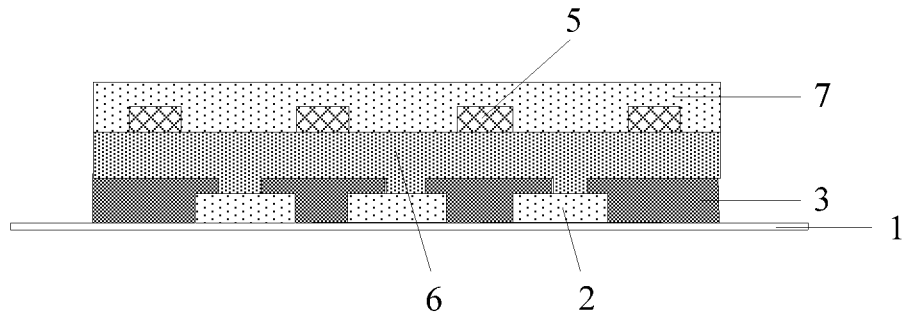
FIG. 2 is a third schematic cross-section view of the light-emitting substrate provided by at least an embodiment of the disclosure.

For example, as illustrated in FIG. 2, in a case where the light-emitting layer 6 for the plurality of pixel units is formed continuously, the auxiliary electrode strips 5 are provided on the light-emitting layer 6.

For example, as illustrated in FIG. 1A and FIG. 1B, in a case where the light-emitting layers 6 of the plurality of pixel units 14 are spaced apart from each other, each of the pixel units 14 corresponds to one of the light-emitting layers 6, the light-emitting layers 6 of different pixel units 14 are spaced apart from each other, and the plurality of auxiliary electrode strips 5 are on the first partition wall structure 3; and for each auxiliary electrode strip 5, the auxiliary electrode strip is in a region between the light-emitting layers 6 of the pixel units adjacent to the auxiliary electrode strip 5. Compared with the embodiment illustrated in FIG. 2, in the embodiment illustrated in FIG. 1A and FIG. 1B, the auxiliary electrode strip 5 is in the region between the light-emitting layers 6 of the pixel units 14 adjacent to the auxiliary electrode strip 5, which prevents the light-emitting layers 6 from being affected by a manufacturing process of the auxiliary electrode strips 5.

For example, a manufacturing method of the auxiliary electrode strips, the light-emitting layers and the cathode layer as illustrated in FIG. 1A and FIG. 1B includes: forming the auxiliary electrode strips 5 on the partition wall structure 3; forming a sacrificial layer (not shown in figures) which is electrically insulated so that orthographic projections of a plurality of sacrificial layer patterns included in the sacrificial layer on a plane in which the auxiliary electrode strips 5 are provided are respectively within regions where the auxiliary electrode strips 5 are respectively located; then forming a continuous light-emitting material layer used for forming the light-emitting layers 6 on the sacrificial layer; then heating the sacrificial layer (for example, heating the sacrificial layer by applying a preset voltage for a preset time period to the auxiliary electrode strips 5) to turn at least a part of the sacrificial layer into powder; removing the at least a part of the sacrificial layer and a portion of the light-emitting material layer which is on the at least a part of the sacrificial layer at the same time, which patterns the light-emitting material layer to form the light-emitting layers 6 of the plurality of pixel units 14; then forming the cathode layer 7 on the light-emitting layers 6 obtained, so that the auxiliary electrode strips 5 below the at least a part of the sacrificial layer which is removed are electrically connected to the cathode layer 7 (for example, the auxiliary electrode strips 5 contact the cathode layer 7 to realize an electrical connection between the auxiliary electrode strips 5 and the cathode layer 7).

In at least one embodiment of the present disclosure, the light-emitting layers 6 are formed after forming of the auxiliary electrode strips 5, in this case, for example, a top of each auxiliary electrode strip 5 is below tops of the light-emitting layers 6 of the pixel units 14 adjacent to the auxiliary electrode strip 5.

In some embodiments, all the sacrificial layer patterns included by the sacrificial layer are removed, and in this case, as illustrated in FIG. 1A, all the plurality of auxiliary electrode strips 5 included by the auxiliary electrode are connected to the cathode layer 7. In some other embodiments, a part of the sacrificial layer patterns included by the sacrificial layer are not removed, and in this case, as illustrated in FIG. 1B, the light-emitting substrate provided by at least one embodiment of the present disclosure further includes a sacrificial layer pattern 13 which is electrically insulated, and the sacrificial layer pattern 13 is between the part of the auxiliary electrode strips 5 and the cathode layer 7, that is, the sacrificial layer pattern 13 is between a layer where the plurality of auxiliary electrode strips 5 are provided and the cathode layer 7. For example, a light-emitting layer pattern 60 is between the sacrificial layer pattern 13 and the cathode layer 7 and between adjacent pixel units 14, and the light-emitting layer pattern 60 and the light-emitting layer 6 are in a same layer and are formed of a same material (that is, the light-emitting pattern 60 and the light-emitting layer 6 are formed from a same material).

For example, a material of the sacrificial layer is an organic material (for example, polyimide or other organic materials) which includes metal nano-particles (for example, the metal nano-particles are nano-metal ions). In other words, the material of the sacrificial layer is an organic material containing metal particles with a size of 1 nm-100 nm. Correspondingly, a material of the sacrificial layer pattern 13 includes an organic material mixed with the metal nano-particles (for example, nano-metal ions).

In at least one embodiment of the present disclosure, because the material of the sacrificial layer includes metal nano-particles, in a case where the sacrificial layer is heated, the sacrificial layer becomes loose and then turns into powder, and the portion of the light-emitting material layer in contact with the sacrificial layer turns into powder with the change of the sacrificial layer. Then, for example, a powdered sacrificial layer and a powdered light-emitting material layer are removed by an adsorption method in a vacuum environment, so that surfaces of at least a part of the auxiliary electrode strips 5 are exposed. Compared with a method of patterning the light-emitting material layer by laser to form the light-emitting layers, the embodiment of the present disclosure reduces a manufacturing cost.

For example, the sacrificial layer is formed by an inkjet printing method. Using the inkjet printing method can precisely control the position of the sacrificial layer and prevent the anodes 2 of the pixel units 14 from being covered by the material of the sacrificial layer.

In order to prevent the light-emitting layers 6 which is formed after forming of the sacrificial layer from being affected when the auxiliary electrode strips 5 are applied with the voltage to burn the sacrificial layer, and in order to control the flow of the material for forming the sacrificial layer when the inkjet printing method is used to form the sacrificial layer, for example, before forming the auxiliary electrode strips 5, forming a second partition wall structure 4 on the first partition wall structure 3, as illustrated in FIG. 1A and FIG. 1B, that is, the second partition wall structure 4 is provided at two sides of each auxiliary electrode strip 5, the two sides of which are opposite to the pixel units 14 adjacent to the auxiliary electrode strip 5 (that is, the second partition wall structure 4 is provided at two opposite sides of each auxiliary electrode strip 5 and is between the adjacent pixel units 14 adjacent to the auxiliary electrode strip 5). The bottom of the second partition wall structure 4 is connected to the top of the first partition wall structure 3, and the second partition wall structure 4 is used to separate each auxiliary electrode strip 5 from the light-emitting layers 6 of the pixel units 14 adjacent to the auxiliary electrode strip 5.

For example, a material of the second partition wall structure 4 is the same as the material of the first partition wall structure 3. For example, both the second partition wall structure 4 and the first partition wall structure 3 are manufactured by processes of coating photoresist, exposure, etching etc., and the second partition wall structure 4 is manufactured after finishing manufacturing the first partition wall structure 3.

For example, in at least one embodiment of the present disclosure, the anodes are reflective anodes. For example, a material of the anodes is ITO/Ag/ITO or other metal materials, wherein ITO is indium tin oxide. For example, the cathode layer is a transparent cathode layer. For example, a material of the cathode layer can be a metal material such as Mg/Ag or an IZO (Indium zinc oxide) film material or other transparent conductive materials.

Figure 3:
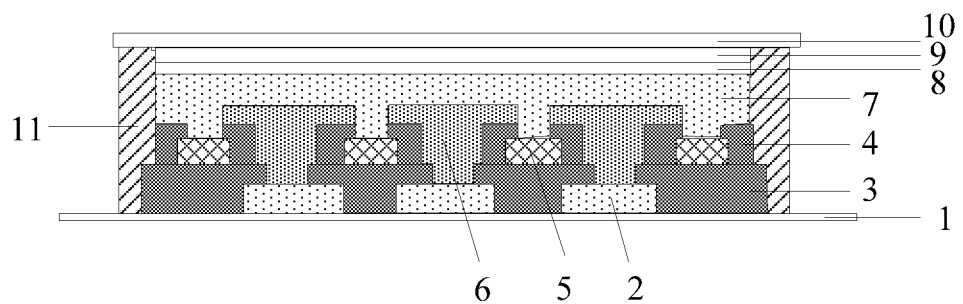
FIG. 3 is a fourth schematic cross-section view of the light-emitting substrate provided by at least an embodiment of the disclosure.

For example, referring to FIG. 3, a film sealing layer 8, a filling adhesive 9 and a cover substrate 10 are sequentially provided on the cathode layer 7, and a third partition wall structure 11 is provided between the cover substrate 10 and the base substrate 1. For example, an inorganic layer or a plurality of inorganic layers formed on the cathode layer 7 by a method of PECVD (plasma enhanced chemical vapor deposition) can serve as the film sealing layer 8. For example, a material of the film sealing layer 8 can include one or more of $SiN_X$, $SiO_2$, SiO or $AiO_X$ etc. For example, the filling adhesive 9 can be formed on the film sealing layer 8 by a method of dispenser or screen printing. Water and oxygen can be blocked in a direction perpendicular to the base substrate 1 and the pixel units can be protected by arranging the cover substrate 10.

At least one embodiment of the present disclosure further provides a manufacturing method of a light-emitting substrate, the manufacturing method is used for manufacturing the light-emitting substrate provided by any one of the embodiments of present disclosure, and the manufacturing method includes: referring to FIG. 1A to FIG. 2, forming a plurality of pixel units 14 arranged in an array and forming an auxiliary electrode which includes a plurality of auxiliary electrode strips 5 on a base substrate 1, and forming a cathode layer 7 covering the plurality of pixel units 14 and a region which is between adjacent ones of the pixel units 14, wherein each of the pixel units 14 includes an anode 2 and a light-emitting layer 6 sequentially provided on the base substrate 1, each of the auxiliary electrode strips 5 is in the region between the adjacent ones of the pixel units 14, all the auxiliary electrode strips 5 are below the cathode layer 7 and at least a part of the plurality of auxiliary electrode strips 5 is electrically connected to the cathode layer 7.

Figure 4:
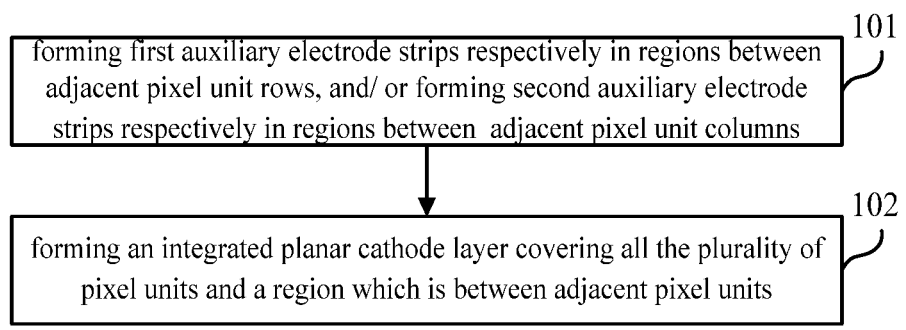
FIG. 4 is a manufacturing flow-process diagram of the light-emitting substrate provided by at least an embodiment of the disclosure.

As illustrated in FIG. 4, the manufacturing method provided by at least one embodiment of the present disclosure further includes the following step 101 and step 102.

Step 101: forming first auxiliary electrode strips respectively in regions between adjacent ones of the pixel unit rows, and/or forming second auxiliary electrode strips respectively in regions between adjacent ones of the pixel unit columns. That is, the plurality of auxiliary electrode strips included by the auxiliary electrode are formed in the step 1, and the plurality of auxiliary electrode strips include the first auxiliary electrode strips and/or the second auxiliary electrode strips.

For example, before forming the first auxiliary electrode strips respectively in the regions between adjacent ones of the pixel unit rows and/or forming the second auxiliary electrode strips respectively in the regions between adjacent ones of the pixel unit columns, the manufacturing method further includes: forming a pixel definition layer on the base substrate, so that the pixel definition layer includes a first partition wall structure provided in the regions between adjacent ones of the pixel unit rows and in the regions between adjacent ones of the pixel unit columns; and forming a second partition wall structure on the first partition wall structure and at two opposite sides of adjacent pixel units, so that the bottom of the second partition wall structure is connected to the top of the first partition wall structure, and the second partition wall structure is used to prevent the first auxiliary electrode strips and/or the second auxiliary electrode strips from contacting the light-emitting material layers of the pixel units adjacent to them.

Forming the first auxiliary electrode strips respectively in the regions between adjacent ones of the pixel unit rows and/or forming the second auxiliary electrode strips respectively in the regions between adjacent ones of the pixel unit columns, for example, includes: forming the first auxiliary electrode strips respectively in spaces, each of which is formed by two opposite portions of the second partition wall structure between adjacent ones of the pixel unit rows, and/or forming second auxiliary electrode strips respectively in spaces, each of which is formed by two opposite portions of the second partition wall structure between adjacent ones of the pixel unit columns.

Step 102: forming an integrated planar cathode layer covering all the plurality of pixel units and the region which is between the adjacent ones of the pixel units, so that the first auxiliary electrode strips are in contact with the cathode layer and are provided below the cathode layer, or the second auxiliary electrode strips are in contact with the cathode layer and are provided below the cathode layer, or both the first auxiliary electrode strips and the second auxiliary electrode strips are in contact with the cathode layer and are provided below the cathode layer.

For example, as for the step 102, before forming the integrated planar cathode layer covering all the plurality of pixel units and the region which is between the adjacent ones of the pixel units, the manufacturing method further includes: forming a sacrificial layer which is electrically insulated and includes a plurality of sacrificial layer patterns spaced apart from each other in a region corresponding to the plurality of auxiliary electrode strips, for example, forming the sacrificial layer in the region corresponding to the plurality of auxiliary electrode strips by an inkjet printing method; forming a light-emitting material layer covering the plurality of pixel units and the region which is between the adjacent ones of the pixel units; and removing a portion of the sacrificial layer provided on the at least a part of the plurality of auxiliary electrode strips and a portion of the light-emitting material layer provided on the at least a part of the plurality of auxiliary electrode strips, so that the at least a part of the plurality of auxiliary electrode strips is electrically connected with the cathode layer.

For example, the portion of the sacrificial layer provided on the at least a part of the plurality of auxiliary electrode strips and the portion of the light-emitting material layer provided on the at least a part of the plurality of auxiliary electrode strips are removed by a method of heating the sacrificial layer in a vacuum environment.

For example, a heating temperature of the method of heating the sacrificial layer is less than or equal to 100 degrees Celsius, for example, the heating temperature is larger than or equal to 90 degrees Celsius and less than or equal to 100 degrees Celsius. Heating the sacrificial layer in the above-mentioned range of temperature can avoid effect caused by the heating on the light-emitting layer in a case where the light-emitting layer is an organic light-emitting layer.

In at least an embodiment of the disclosure, in a case where the portion of the sacrificial layer is heated, the portion of the sacrificial layer produces a large degree of expansion and then becomes loose to form a powdered sacrificial layer due to the expansion, accordingly, the portion of the light-emitting material layer which is directly in contact with the sacrificial layer turns into powdered light-emitting material layer with the change of the sacrificial layer, and the powdered light-emitting material layer and the powdered sacrificial layer are easy to remove. For example, the powdered sacrificial layer and the powdered light-emitting material layer are removed by an adsorption method so that a surface of at least a part of the auxiliary electrode strips 5 is exposed. Compared with a method of patterning the light-emitting material layer by laser to form the light-emitting layers, the embodiment of the present disclosure reduces a manufacturing cost.

For example, a material of the sacrificial layer includes an organic material (for example, polyimide or other organic materials) which includes metal nano-particles (for example, the metal nano-particles are nano-metal ions). In other words, the material of the sacrificial layer includes an organic material containing metal particles with a size of 1 nm-100 nm.

For example, the material of the sacrificial layer further includes a foaming agent. In a case where the sacrificial layer is heated, the foaming agent produces bubbles, which is beneficial to making the portion of the sacrificial layer heated become loose and turn into powder.

For example, a mass fraction of the metal nano-particles in the sacrificial layer is 20%-50%. In this range of mass fraction, it is easy for the sacrificial layer to turn into powder when the sacrificial layer is heated; if there are too few metal nano-particles in the sacrificial layer, it is not easy for the portion of the sacrificial layer heated to turn into powder; if there are too many metal nano-particles in the sacrificial layer, it is unbeneficial for the foaming agent to produce bubbles.

For example, a coefficient of thermal expansion of the sacrificial layer is greater than a coefficient of the thermal expansion of the second partition wall structure, in this way, it is not easy for the second partition wall structure to be affected in the process of heating the sacrificial layer to pattern the light-emitting material layer and then to form the light-emitting layer.

For example, in a vacuum environment, a preset voltage is applied for a preset time period to the plurality of auxiliary electrode strips to burn the portion of the sacrificial layer provided on the at least a part of the plurality of auxiliary electrode strips and the portion of the light-emitting material layer corresponding to the region where the at least a part of the plurality of auxiliary electrode strips is located (namely, to make the sacrificial layer and the light-emitting material layer respectively turn into the powdered sacrificial layer and the powdered light-emitting material layer), so that it is beneficial to electrically connect the at least a part of the plurality of auxiliary electrode strips with the cathode layer (for example, the at least a part of the plurality of auxiliary electrode strips is in contact with the cathode layer to realize an electrical connection between the at least a part of the plurality of auxiliary electrode strips and the cathode layer) by adsorption.

It should be noted that in a case where the auxiliary electrode strips of the auxiliary electrode includes the first auxiliary electrode strips and the second auxiliary electrode strips, the first auxiliary electrode strips are electrically connected with the second auxiliary electrode strips, so that the plurality of auxiliary electrode strips can generate heat when the voltage is applied to them; in a case where the auxiliary electrode strips of the auxiliary electrode only includes the plurality of first auxiliary electrode strips or only includes the plurality of second auxiliary electrode strips, the first auxiliary electrode strips can be electrically connected with each other or the plurality of second auxiliary electrode strips can be electrically connected with each other first, and then the voltage is applied to the plurality of first auxiliary electrode strips to make the plurality of first auxiliary electrode strips generate heat or the voltage is applied to the plurality of second auxiliary electrode strips to make the plurality of second auxiliary electrode strips generate heat. It can be seen from this, the case where the plurality of auxiliary electrode strips of the auxiliary electrode include the first auxiliary electrode strips and the second auxiliary electrode strips is more beneficial to applying the voltage to the auxiliary electrode strips.

For example, a ratio of a thickness of the sacrificial layer and a thickness of the light-emitting material layer is greater than or equal to 1 in a region where the sacrificial layer is in contact with the light-emitting material layer, for example, the ratio is greater than or equal to 1 and less than or equal to 2. For example, the thickness of the light-emitting material layer is less than or equal to 4 micrometers. In a case where the thickness of the portion of the light-emitting material layer in contact with the sacrificial layer is less than the thickness of the sacrificial layer, it is beneficial to powdering the portion of the light-emitting material layer with the change of the sacrificial layer.

In at least one embodiment of the present disclosure, the sacrificial layer is formed by the inkjet printing method, and the voltage is applied to the auxiliary electrode strips to burn the portion of the sacrificial layer provided on the at least a part of the plurality of auxiliary electrode strips and the portion of the light-emitting material layer corresponding to the region where the at least a part of the plurality of auxiliary electrode strips is located, so that the at least a part of the plurality of auxiliary electrode strips is electrically connected with the cathode layer. Compared with the method of arranging the auxiliary electrode strips on the cathode layer, the embodiments of the present disclosure can precisely control the position of the sacrificial layer during the manufacturing, and it is easy to enable the auxiliary electrode to be electrically connected with the cathode layer, so that it is easy to reduce the voltage difference of the cathode layer of a large-size light-emitting substrate.

For example, forming the sacrificial layer in the region corresponding to the plurality of auxiliary electrode strips includes: forming the sacrificial layer formed of an organic material (for example, polyimide or other organic materials) which contains metal nano-particles (for example, the metal nano-particles are nano-metal ions) in the region corresponding to the plurality of auxiliary electrode strips.

For example, after forming the cathode layer, in order to test the effect of removing the portion of the sacrificial layer to ensure the electrical connection between the auxiliary electrode and the cathode layer, the manufacturing method provided by at least one embodiment of the present disclosure further includes: testing a current or capacitance between the cathode layer and each of the auxiliary electrode strips included in the auxiliary electrode. For each auxiliary electrode strip, in a case where the auxiliary electrode strip is electrically connected to the cathode layer, the capacitance between the cathode layer and the auxiliary electrode strip is about 0 and the current flowing through the cathode layer and the auxiliary electrode strip is greater than a certain value; in a case where the auxiliary electrode strip is not electrically connected to the cathode layer, the capacitance between the cathode layer and the auxiliary electrode strip is greater than a certain value and the current flowing through the cathode layer and the auxiliary electrode strip is about 0. According to this principle, the effect of removing the portion of the sacrificial layer can be tested, and heating parameters of the sacrificial layer can be determined according to a result of multiple tests (for example, the above-mentioned voltage holding for the preset time period can be determined).

The manufacturing method provided by at least one embodiment of the present disclosure is described in the following combining FIG. 5-FIG. 11.

For example, the manufacturing method provided by at least one embodiment of the present disclosure includes the step one to the step eight in the following.

Figure 5:
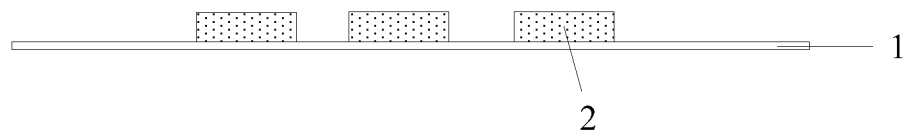
FIG. 5 is a structural schematic view of the light-emitting substrate in which preparation of anodes are finished in at least an embodiment of the disclosure.

Step one: forming patterned reflective anodes 2 (for example, a material of the reflective anodes is ITO/Ag/ITO) on a base substrate 1 by a sputtering method, for example, so that each of the pixel units is corresponding to an independent anode 2, as illustrated in FIG. 5.

In the step one, for example, the base substrate 1 can be a glass substrate or a flexible substrate.

Figure 6:
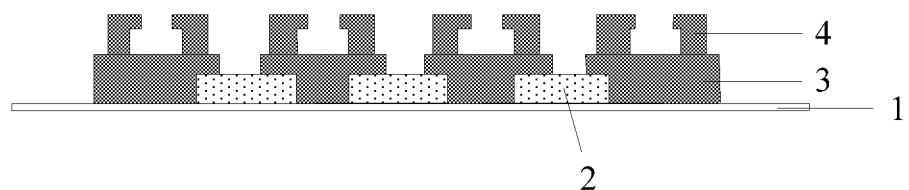
FIG. 6 is a structural schematic view of the light-emitting substrate in which preparation of a first partition wall structure and a second partition wall structure are finished in at least an embodiment of the disclosure.

Step two: sequentially forming a first partition wall structure 3 and a second partition wall structure 4, each of which is formed by a process of coating, exposure and etching, as illustrated in FIG. 6.

Figure 7:
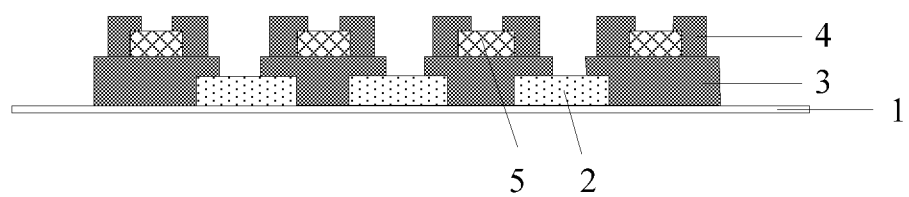
FIG. 7 is a structural schematic view of the light-emitting substrate in which preparation of an auxiliary electrode is finished in at least an embodiment of the disclosure.

Step three: forming auxiliary electrode strips 5 outside of a region which the anode 2 corresponds to and within openings of the second partition wall structure 4, as illustrated in FIG. 7.

In the step three, for example, the auxiliary electrode strips 5 are formed by a method of evaporation or sputtering or inkjet printing; for example, a material of the auxiliary electrode strips 5 includes a metal (s), for example, the metal is Ag or Mo or other metals. It should be noted that in some embodiments of the present disclosure, the order of the step two for manufacturing the second partition wall structure 4 and the order of the step three for forming the auxiliary electrode strips 5 can be interchanged.

Figure 8:
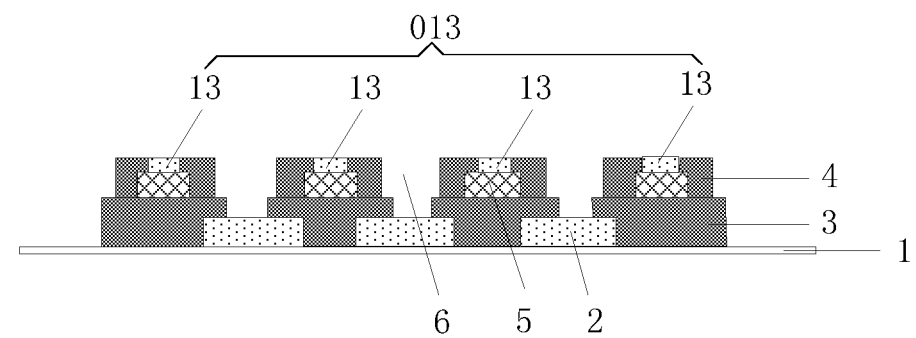
FIG. 8 is a structural schematic view of the light-emitting substrate in which preparation of a sacrificial layer is finished in at least an embodiment of the disclosure.

Step four: coating a sacrificial material layer (for example, the sacrificial material layer contains polyimide) containing metal nano-particles by inkjet printing in a region corresponding to the auxiliary electrode strips 5, that is, the orthographic projections of the auxiliary electrode strips 5 on the base substrate 1 covers the orthographic projection of the sacrificial material layer on the base substrate 1; and then solidifying the sacrificial material layer by visible light (such as light with a wavelength of 395/405 nm) or ultraviolet light (for example, light with a wavelength of 365 nm) or solidifying the sacrificial material layer by heating or other methods so as to obtain a sacrificial layer 013 including a plurality of sacrificial layer patterns 13 spaced apart with each other, as illustrated in FIG. 8.

In the step four, a material of the sacrificial layer is a thermosensitive functional material which becomes loose and turns into powder at a relatively low temperature (for example, 90-100 degrees); in follow-up steps, the powder produced by the sacrificial layer 013 can be removed in a vacuum environment, and then a transparent cathode layer formed later is electrically connected with the auxiliary electrode strips so as to reduce the voltage drop of the transparent cathode layer. For example, in follow-up steps, a voltage can be applied to the auxiliary electrode strips to enable at least a part of the sacrificial layer to produce bubbles and become loose and then turn into powder.

Figure 9:
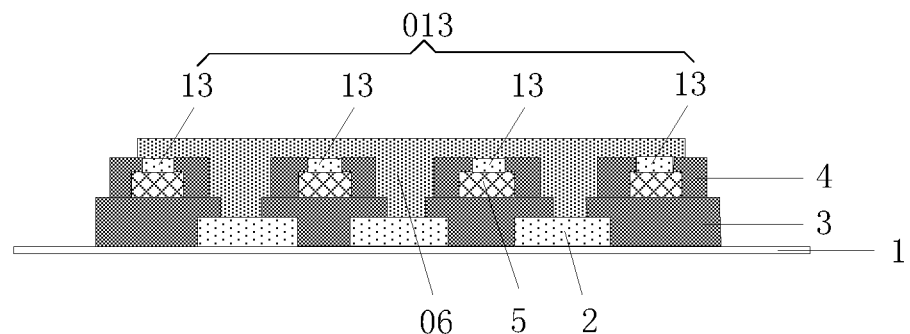
FIG. 9 is a structural schematic view of the light-emitting substrate in which preparation of a light-emitting material layer is finished in at least an embodiment of the disclosure.

Step five: forming a light-emitting material layer 06 by a method of evaporation, as illustrated in FIG. 9.

Step six: applying a preset voltage for a preset time period to the auxiliary electrode strips 5 below the sacrificial layer 013 to burn a portion of the sacrificial layer 013 provided on at least a part of the auxiliary electrode strips 5 and a portion of the light-emitting material layer 06 corresponding to the at least a part of the auxiliary electrode strips 5, so that the at least a part of the auxiliary electrode strips 5 is in contact with the cathode layer 7 formed in follow-up steps.

Figure 10:
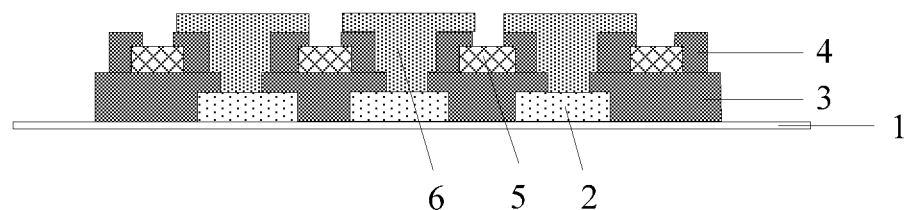
FIG. 10 is a structural schematic view of the light-emitting substrate in which the light-emitting material layer on the auxiliary electrode is removed in at least an embodiment of the disclosure.

In the step six, a schematic view of removing all the portion of the light-emitting layer 06 on the auxiliary electrode strips 5 and all the sacrificial layer 013 on the auxiliary electrode strips 5 is illustrated as FIG. 10. In some embodiments of the present disclosure, the sacrificial layer patterns 13 of the sacrificial layer 013 are not removed completely, and in this case, a schematic view of the light-emitting substrate is illustrated as FIG. 1B.

Figure 11:
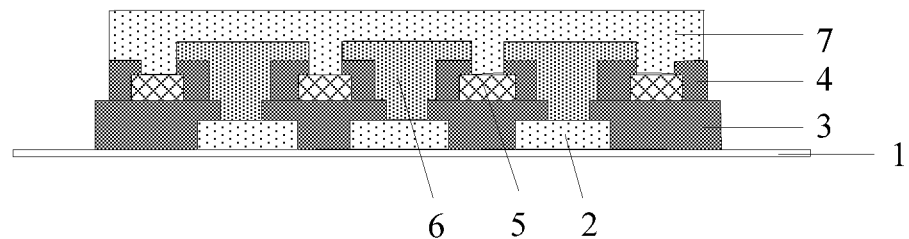
FIG. 11 is a structural schematic view of the light-emitting substrate in which preparation of a cathode layer is finished in at least an embodiment of the disclosure.

Step seven: performing deposition of the transparent cathode layer 7 (for example, a material of the transparent cathode layer 7 is Mg/Ag) after the potion of the sacrificial layer 013 on the at least a part of the auxiliary electrode strips is removed, as illustrated in FIG. 11.

Step eight: as illustrated in FIG. 3, depositing an inorganic film sealing layer 8 (for example, a material of the inorganic film sealing layer 8 includes SiN and/or $SiO_2$); for example, coating of a filling adhesive 9 is realized by a method of adhesive dispensing; for example, coating of a third partition wall structure (dam) 11 with a high viscosity is realized by a method of adhesive dispensing to enable the third partition wall structure 11 have a function of blocking water and oxygen laterally and protecting the light-emitting layer; and forming a cover substrate 10, so that the cover substrate 10 has a function of blocking water and oxygen in a direction perpendicular to the base substrate 1 and protecting the pixel units.

In at least one embodiment of the present disclosure, the light-emitting substrate further includes a planar cathode layer covering the plurality of pixel units and the region which is between the adjacent ones of the pixel units, and the plurality of auxiliary electrode strips which are in contact with the cathode layer are provided below the cathode layer. Because the auxiliary electrode strips are in parallel connection with the cathode layer and are below the cathode layer, at least one embodiment of the present disclosure can reduce the voltage difference between the center portion and the peripheral portion of the cathode layer of a large-size light-emitting substrate, and can ensure the sealing effect of the sealing layer on the cathode layer, reduce the difficulty of alignment and increase the production yield at the same time.

What are described above is related to the illustrative embodiments of the disclosure only and not limitative to the scope of the disclosure; the scopes of the disclosure are defined by the accompanying claims.

What is claimed is:

1. A light-emitting substrate, comprising a base substrate and a plurality of pixel units arranged in an array on the base substrate, wherein
   the plurality of pixel units form a plurality of pixel unit rows and a plurality of pixel unit columns;
   each of the pixel units comprises an anode and a light-emitting layer which are sequentially on the base substrate;
   the light-emitting substrate further comprises a cathode layer covering the plurality of pixel units and a region which is between adjacent ones of the pixel units;
   an auxiliary electrode is below the cathode layer, the auxiliary electrode comprises a plurality of auxiliary electrode strips, the plurality of auxiliary electrode strips comprise a plurality of first auxiliary electrode strips extending along an extension direction of each of the pixel unit rows and/or a plurality of second auxiliary electrode strips extending along an extension direction of each of the pixel unit columns, and at least a part of the plurality of auxiliary electrode strips is electrically connected to the cathode layer;
   the first auxiliary electrode strips are respectively in regions between adjacent ones of the pixel unit rows; and the second auxiliary electrode strips are respectively in regions between adjacent ones of the pixel unit columns;
   the light-emitting substrate further comprises a pixel definition layer which defines the plurality of pixel units of the light-emitting substrate, wherein
   the pixel definition layer comprises a first partition wall structure which is in the regions between the adjacent ones of the pixel unit rows and in the regions between the adjacent ones of the pixel unit columns;
   each of the pixel units comprises one light-emitting layer, and the light-emitting layers of different ones of the pixel units are spaced apart from each other; and
   the plurality of auxiliary electrode strips are on the first partition wall structure, and each auxiliary electrode strip is in a region between the light-emitting layers of the pixel units adjacent to the auxiliary electrode strip.

2. The light-emitting substrate according to claim 1, wherein a top of each auxiliary electrode strip is below tops of the light-emitting layers of the pixel units adjacent to the auxiliary electrode strip.

3. The light-emitting substrate according to claim 1, wherein a second partition wall structure is at two sides of each auxiliary electrode strip, the two sides of which are opposite to the pixel units adjacent to the auxiliary electrode strip, a bottom of the second partition wall structure is connected to a top of the first partition wall structure, and each auxiliary electrode strip is spaced apart from the light-emitting layers of the pixel units adjacent to the auxiliary electrode strip by the second partition wall structure.

4. The light-emitting substrate according to claim 3, further comprising a sacrificial layer pattern, wherein the sacrificial layer pattern is between a layer where the plurality of auxiliary electrode strips are provided and the cathode layer.

5. The light-emitting substrate according to claim 4, wherein a material of the sacrificial layer pattern comprises an organic material mixed with metal nano-particles.

6. The light-emitting substrate according to claim 1, wherein the anode is a reflective anode, and the cathode layer is a transparent cathode layer.

7. A light-emitting substrate, comprising a base substrate and a plurality of pixel units arranged in an array on the base substrate, wherein
   the plurality of pixel units form a plurality of pixel unit rows and a plurality of pixel unit columns;
   each of the pixel units comprises an anode and a light-emitting layer which are sequentially on the base substrate;
   the light-emitting substrate further comprises a cathode layer covering the plurality of pixel units and a region which is between adjacent ones of the pixel units;
   an auxiliary electrode is below the cathode layer, the auxiliary electrode comprises a plurality of auxiliary electrode strips, the plurality of auxiliary electrode strips comprise a plurality of first auxiliary electrode strips extending along an extension direction of each of the pixel unit rows and/or a plurality of second auxiliary electrode strips extending along an extension direction of each of the pixel unit columns, and at least a part of the plurality of auxiliary electrode strips is electrically connected to the cathode layer;
   the first auxiliary electrode strips are respectively in regions between adjacent ones of the pixel unit rows; and the second auxiliary electrode strips are respectively in regions between adjacent ones of the pixel unit columns;
   the light-emitting substrate further comprises a pixel definition layer on the base substrate, wherein
   the pixel definition layer defines the plurality of pixel units of the light-emitting substrate,
   the pixel definition layer comprises a first partition wall structure which is in the regions between the adjacent ones of the pixel unit rows and in the regions between the adjacent ones of the pixel unit columns; and the light-emitting layer covers the plurality of pixel units and the region which is between the adjacent ones of the pixel units, and the plurality of auxiliary electrode strips are on the light-emitting layer.

8. A manufacturing method of a light-emitting substrate, comprising:

forming a plurality of pixel units arranged in an array and forming an auxiliary electrode which comprises a plurality of auxiliary electrode strips on a base substrate, and forming a cathode layer covering the plurality of pixel units and a region which is between adjacent ones of the pixel units, wherein the plurality of pixel units comprise a plurality of pixel unit rows and a plurality of pixel unit columns, the plurality of auxiliary electrode strips comprise first auxiliary electrode strips formed respectively in regions between adjacent ones of the pixel unit rows and/or second auxiliary electrode strips formed respectively in regions between adjacent ones of the pixel unit columns, and each of the pixel units comprises an anode and a light-emitting layer which are sequentially on the base substrate, and the plurality of auxiliary electrode strips are below the cathode layer and at least a part of the plurality of auxiliary electrode strips is electrically connected to the cathode layer;

wherein the manufacturing method further comprises:

before forming the plurality of auxiliary electrode strips, forming a pixel definition layer on the base substrate, wherein the pixel definition layer comprises a first partition wall structure which is in the regions between the adjacent ones of the pixel unit rows and in the regions between the adjacent ones of the pixel unit columns; and forming a second partition wall structure on the first partition wall structure and at two opposite sides of the adjacent ones of the pixel units, wherein a bottom of the second partition wall structure is connected to a top of the first partition wall structure, and each auxiliary electrode strip is spaced apart from the light-emitting layers of the pixel units adjacent to the auxiliary electrode strip by the second partition wall structure;

wherein forming the plurality of auxiliary electrode strips comprises: forming the first auxiliary electrode strips respectively in first spaces, each of which is formed by two opposite portions of the second partition wall structure between the adjacent ones of the pixel unit rows, and/or forming the second auxiliary electrode strips respectively in second spaces, each of which is formed by two opposite portions of the second partition wall structure between the adjacent ones of the pixel unit columns;

and/or the manufacturing method before forming the cathode layer, further comprises:

forming a sacrificial layer in a region corresponding to the plurality of auxiliary electrode strips;

forming a light-emitting material layer covering the plurality of pixel units and the regions which are respectively between the adjacent ones of the pixel units; and removing a portion of the sacrificial layer and on the at least a part of the plurality of auxiliary electrode strips and removing a portion of the light-emitting material layer and on the at least a part of the plurality of auxiliary electrode strips, so that the at least a part of the plurality of auxiliary electrode strips is electrically connected with the cathode layer.

9. The manufacturing method according to claim 8, wherein the portion of the sacrificial layer and on the at least a part of the plurality of auxiliary electrode strips and the portion of the light-emitting material layer and on the at least a part of the plurality of auxiliary electrode strips are removed by heating the sacrificial layer.

10. The manufacturing method according to claim 9, wherein a heating temperature of heating the sacrificial layer is less than or equal to 100 degrees Celsius.

11. The manufacturing method according to claim 9, wherein the sacrificial layer which is heated forms a powdered sacrificial layer due to expansion, and the portion of the light-emitting material layer forms a powdered light-emitting material layer; and the manufacturing method further comprises: removing the powdered sacrificial layer and the powdered light-emitting material layer by adsorption.

12. The manufacturing method according to claim 8, wherein a preset voltage is applied for a preset time period to the plurality of auxiliary electrode strips to remove the portion of the sacrificial layer and on the at least a part of the plurality of auxiliary electrode strips and remove the portion of the light-emitting material layer and on the at least a part of the plurality of auxiliary electrode strips.

13. The manufacturing method according to claim 8, wherein a ratio of a thickness of the sacrificial layer to a thickness of the light-emitting material layer is greater than or equal to 1 in a region where the sacrificial layer is in contact with the light-emitting material layer.

14. The manufacturing method according to claim 8, wherein the sacrificial layer is formed by using an inkjet printing method.

15. The manufacturing method according to claim 8, wherein a material of the sacrificial layer comprises an organic material mixed with metal nano-particles.

16. The manufacturing method according to claim 15, wherein the material of the sacrificial layer further comprises a foaming agent.

* * * * *